United States Patent [19]
Amann

[11] Patent Number: 5,511,084
[45] Date of Patent: Apr. 23, 1996

[54] TUNABLE LASER DIODE

[75] Inventor: Markus-Christian Amann, Baunatal, Germany

[73] Assignee: Siemens Aktiengesellschaft, Munich, Germany

[21] Appl. No.: 372,936

[22] Filed: Jan. 17, 1995

[30]  Foreign Application Priority Data

Jan. 19, 1994 [DE] Germany .......................... 44 01 444.9

[51] Int. Cl.$^6$ ................................ H01S 3/10; H01S 3/19
[52] U.S. Cl. ................................ 372/20; 372/45; 372/46; 372/50
[58] Field of Search ................................ 372/20, 50, 45, 372/46

[56]  References Cited

U.S. PATENT DOCUMENTS

| | | | |
|---|---|---|---|
| 4,054,363 | 10/1977 | Suematsu | 385/14 |
| 5,008,893 | 4/1991 | Amann et al. | 392/50 |
| 5,105,433 | 4/1992 | Eisele et al. | 372/50 |
| 5,422,898 | 6/1995 | Kosh et al. | 372/23 |

FOREIGN PATENT DOCUMENTS

| | | |
|---|---|---|
| 0360011 | 3/1990 | European Pat. Off. . |
| 0487876 | 10/1991 | European Pat. Off. . |
| 0552390 | 1/1992 | European Pat. Off. . |
| 3937542 | 5/1991 | Germany . |

OTHER PUBLICATIONS

Codirectionally Coupled Twin–Guide Laser Diode for Broadband Electronic Wavelength Tuning Electronics Letters vol. 27, No. 24 pp. 2207–2208, 21 Nov. 1991.
Broadly Tunable InGaAsP/InP Vertical–Coupler Filtered Laser with Low Tuning Current, Electronics Letters, vol. 29, No. 8, pp. 664–666, 15 Apr. 1993.
Widely Tunable Distributed Forward Coupled (DFC) Laser, Amann et al., Electronics Letters, vol. 29, No. 9, pp. 793–794, 29 Apr. 1993.
74 nm Wavelength Tuning Range of an InGaAsP/InP Vertical Grating Assisted Codirectional Coupler Laser with Rear Sampled Grating Reflector, Nilsson et al., IEEE Photonics Technology Letters, vol. 5, No. 7, Jul., 1993, pp. 735–738.
H. Naito et al., "A New Composite–Cavity Laser with Two Different Wave–Guide Cores for Stable Longitudinal Mode Operation", J. Appl. Phys. 66, Dec. 1989, pp. 5726–5730.
Y. Suematsu et al., "Axial–Mode Selectivities for Various Types of Integrated Twin–Guide Lasers", IEEE Journal of Quantum Electronics, vol. QE–13, No. 8, Aug. 1977, pp. 619–622.
M.–C. Amann et al., "Tunable Laser Diodes Utilizing Transverse Tuning Scheme", Journal of Lightwave Technology, No. 7, Jul. 1993, New York, US, pp. 1168–1182.
B. Borchert et al., "Vertically Integrated Mach–Zehnder Interferometer (VMZ) Widely Tunable Laser Diode with Improved Wavelength Access", Electronics Letters, vol. 30, No. 24, Nov. 24, 1994, pp. 2047–2049.

Primary Examiner—James W. Davie
Attorney, Agent, or Firm—Hill, Steadman & Simpson

[57]  ABSTRACT

Tunable laser diode having an integrated Mach-Zehnder interferometer is provided. A first and a second waveguide are arranged vertically relative to one another with respect to the layer plane as stripe-shaped layers. The second waveguide extends over the entire resonator length between mirror end faces, whereas the first waveguide is only present in one or more interconnected sections provided as coupling region. The waveguides are arranged in such close proximity to one another in this coupling region that coupling occurs between modes guided in the waveguides. An active layer and a tuning layer are arranged vertically relative to one another in these waveguides. A separate current injection into this tuning layer and into this active layer are present, and an interconnected section of the waveguide not present over the entire resonator length is a respective, natural multiple of the coupling length of two specific modes in the waveguides to be coupled.

10 Claims, 4 Drawing Sheets

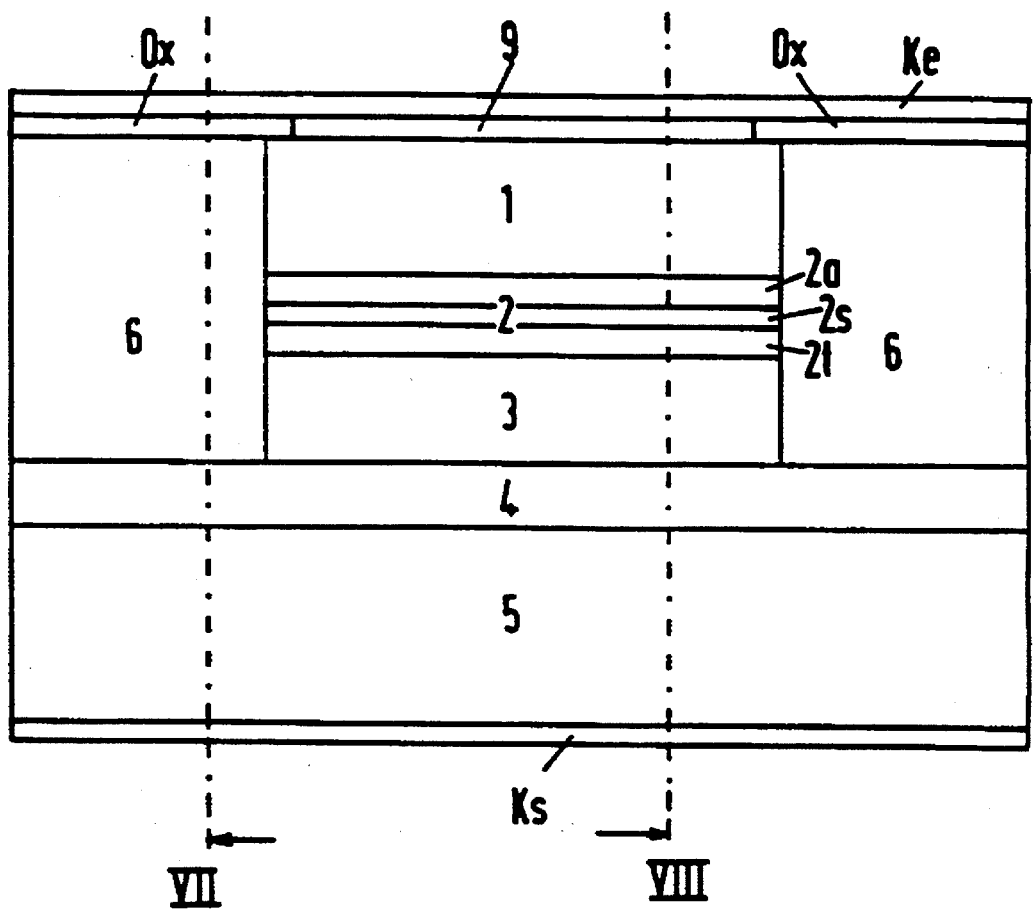

TUNABLE LASER DIODE

BACKGROUND OF THE INVENTION

1. Field of the Invention

The present invention is directed generally to semiconductors and more specifically to a tunable semiconductor laser diode.

2. Description of the Related Art

Laser light sources that are tunable over a broad range are required for advanced optical communication systems. Simple operation and a broad tuning range are required of such laser diodes. A tunable laser diode that is divided into an amplifier region, a coupler region and an absorber region over its length and that is referred to as an ACA laser is described in the publication by S. Illek et al., "Co-Directionally Coupled Twin-Guide Laser Diode for Broadband Electronic Wavelength Tuning" in *Electronics Letters* 27, 2207–2208 (1991). Two waveguides are arranged vertically relative to one another and separated from one another by a cladding layer. Light that propagates in a first mode is generated and amplified in the upper waveguide. This wave is coupled into the lower waveguide in the coupler region. The absorber region prevents the emission of the mode in the upper waveguide. Laser mode becomes possible due to the exchange of the radiation capacity between the two modes guided in the two waveguides.

The publication by I. Kim et al., "Broadly Tunable InGaAsP/InP Vertical-Coupler Filtered Laser With Low Tuning Current" in *Electronics Letters* 29, 664–666 (1993) discloses a VCF laser diode wherein an amplifier region, a coupler region and what is referred to as a window region are arranged following one another. The amplifier region and the coupler region have separate power terminals. The amplifier region has a quantum well layer structure. The suppression of longitudinal side modes is relatively slight given the two structures disclosed in said publications since the wavelength-selective filtering and tuning occurs only in a sub-area of the overall laser diode. This can lead to an inadequate and unstable single-mode emission.

This problem can be essentially avoided when the filtering is distributed over the entire laser length, as, for example, in the DFC laser structure from the publication by M. C. Areann et al., "Widely Tunable Distributed Forward Coupled (DFC) Laser" in *Electronics Letters* 29, 793–794 (1993). Two waveguides are likewise arranged vertically relative to one another and coupled in this structure. Absorption regions that form a filtering grating in longitudinal direction are arranged vertically relative thereto in longitudinal direction.

Another proposed solution for suppressing side modes is disclosed in the publication by M. Oeberg et al., "74 nm Wavelength Tuning Range of an InGaAsP/InP Vertical Grating Assisted Codirectional Coupler Laser with Rear Sampled Grating Reflector" in *IEEE Photonics Technology Letters* 5, 735–738 (1993). The functions of filtering and tuning are thereby separated from one another and are separately optimized. As in the lasers set forth above, the codirectional mode coupling with its relatively slight spectral filtering of the (spectrally proximate) side modes is employed for broadband tuning. The far selection for modes at a greater spectral distance is good in the codirectional mode coupling (particularly when the coupler length corresponds to a coupling length). A great suppression of the side modes is therefore achieved by the additional employment Of a specific Bragg grating structure as laser end mirror. The good near selection of this specific Bragg grating, however, is acquired at the expense of a poor far selection (ambiguity). Due to the good far selection of the codirectional coupler, however, this does not mean a deterioration of the operating properties will result for the overall laser structure. The critical disadvantage of this combination—in addition to the relatively great length—is the critical synchronization of the filter function with the tuning function. This requires an extremely exact adjustment of two control currents and has a decisively negative effect on practical manipulation.

SUMMARY OF INVENTION

An object of the present invention is to specify an optimally short laser diode that is as simple as possible in technological terms and that can be tuned unambiguously, reproducibly and largely single-mode over an extremely broad wavelength range with only one tuning current.

This object is achieved in the tunable laser diode of the present invention. The tunable laser diode has a first and a second waveguide arranged in a layer plane as layers vertically above one another with respect to the layer plane and separated from one another by a cladding layer, the first and second waveguides being arranged so closely adjacent to one another so that a mode coupling occurs between the waveguides. The first waveguide is located only in a coupling region that has a length less than the entire length of a section of the laser diode provided as a laser resonator. The first and second waveguides have dimensions and material combinations such that a coupling of two different modes occurs in the coupling region. The coupling region has at least one interconnected section having a length equal to a natural multiple of the coupling length of the two different modes. The laser also has an active layer and a tuning layer arranged vertically relative to one another with respect to the layer plane in the first and second waveguide in the coupling region, and means for separately injecting currents into the active layer and into the tuning layer.

In the laser of the invention, the filter and tuning functions are not separated from one another; near and far selection can nonetheless be separately optimized. Only one control current is required because of the self-alignment within this laser diode. The combination of the filtering and tuning in one function unit also makes it possible to manufacture extremely short components. Typical lengths of the laser diode of the invention therefore are 200–600 μm. In contrast, the overall structure must usually be a few mm long with previously known components having separate optimization of near and far selection. The functioning of the laser of the invention is based on the principle of the Mach-Zehnder interferometer that is vertically integrated into the laser diode. The abbreviation VMZ laser shall therefore be used below.

In the VMZ laser, a further waveguide coupled to the waveguide provided for the guidance of the laser light is arranged vertically relative to the guidance of the laser light. This further waveguide is present only in a sub-section of the overall length of the laser diode. The filter effect is produced by the coupling of the modes propagatable in the two waveguides. A good near selection as well as a good far selection can be achieved by a providing the second waveguides in a plurality of sections of different length.

A description of the VMZ laser diode of the present invention follows with reference to the figures.

BRIEF DESCRIPTION OF THE DRAWINGS

FIG. 6 shows the layer structure of an embodiment of the present invention in longitudinal section.

DETAILED DESCRIPTION OF THE PREFERRED EMBODIMENTS

Figure 1:
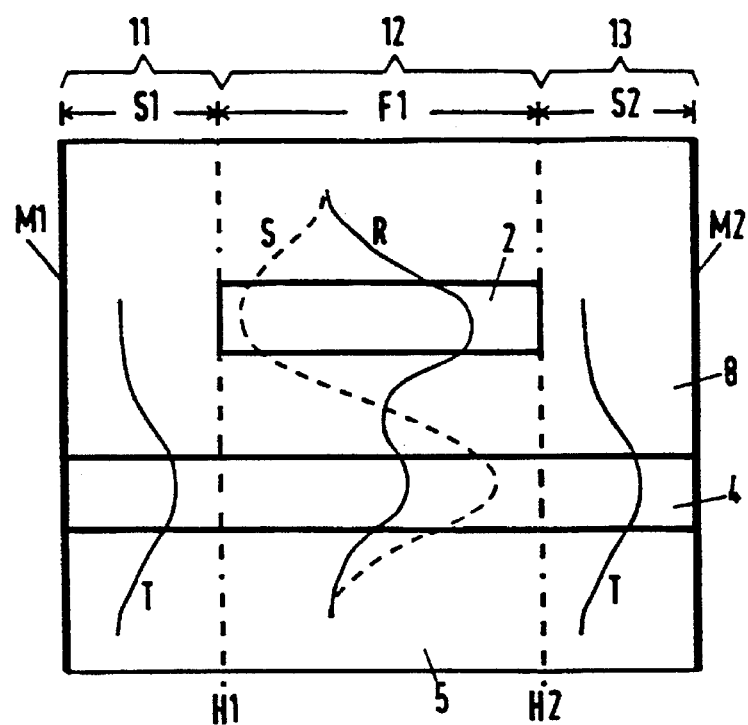
FIGS. 1–4 show various exemplary embodiments of the VMZ laser of the invention in longitudinal section.

In the simplest embodiment of the VMZ laser shown in a schematic longitudinal section in FIG. 1, the length of the laser resonator is divided into three sections. In succession, these sections are: a first single region 11 having the length S1, a double region 12 having the length F1 and a second single region 13 having the length S2. Respectively only one waveguide 4 is present in the single regions, only a transversal mode (mode T) being propagatable therein. A further waveguide 2 is arranged vertically parallel to the first waveguide 4 in the double region 12 provided for the filtering. Two guided modes R and S are propagatable in this double region 12. In the simple illustration of FIG. 1, the waveguide 4 present over the entire length of the component is applied on a lower cladding layer or on a substrate 5. This waveguide 4 is buried into a cladding layer 8 in which the second waveguide 2 is embedded. The mode T of the single regions 11, 13 is coupled with the two modes R and S of the double region 12 at the boundary planes H1, H2. Since the two modes R and S have different phase velocities (different effective refractive indices, wherein the difference of the effective refractive indices is approximately 0.1), a constructive interference of the modes R and S excited by mode T at the boundary surface H1 at the boundary surface H2 given renewed coupling into mode T is only possible at specific, discreet wavelengths. The coupling length is the determining factor for specifying these wavelengths. Constructive interference thus occurs when the length F1 of the double region 12 is a whole multiple of the coupling length. Since the coupling length is equal to the quotient of wavelength and difference between effective refractive indices, the wavelengths of the constructive interference occur as a whole fraction of the product of length F1 of the double region 12 and the difference between the effective refractive indices: $\lambda = F1 \times (n1-n2)/N$, where n1 and n2 are effective refractive indices and N is a natural number.

When N is extremely large, these resonant wavelengths lie extremely close to one another and at approximately identical spacing (given negligible dispersion of the effective refractive indices). When the length F1 is extremely long, the near selection can therefore be extremely high in the immediate environment of a select, resonant wavelength, whereas, on the other hand, a deterioration of the far selection occurs clue to the ambiguity of the filter curve.

Figure 5A:
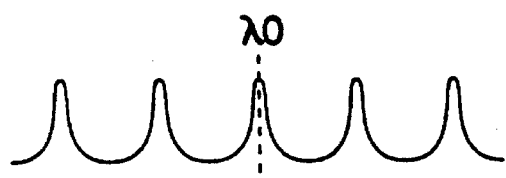
FIG. 5 shows filter curves for various embodiments of the present invention.
Figure 5B:
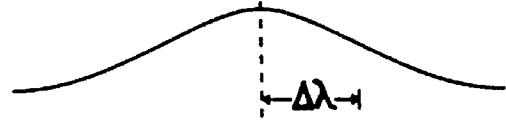
Figure 5C:
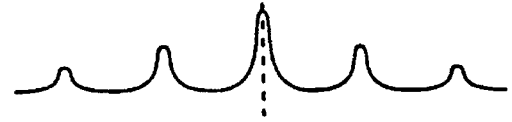

These properties are illustrated with reference to FIGS. 5a–5c, which show the fundamental form of the filter curves. FIG. 5a shows the curve of the transmission characteristic (filter curve) in the wavelength range around a specific resonant wavelength $\lambda_0$ for an extremely large N (for example, N=20). The course of the filter curve is schematically shown in FIG. 5b for N=1. The flatter course of the resonance maximum in this case causes a slight selection of the closest wavelengths. The far selection, however, is substantially greater than in the example of the filter curve of FIG. 5a.

Given the VMZ laser diode, the tuning of the wavelength occurs by modifying the difference of the effective refractive indices with charge carrier injection into one of the waveguides 2, 4 in the double region 12. To this end, electrical contacts are applied to the upper sides of the diode and the regions of the cladding layer 8 are doped such that currents can be separately injected into the two waveguides 2, 4. As shown in FIG. 1, the overall laser resonator is limited by the laser end mirrors M1, M2.

Figure 2:
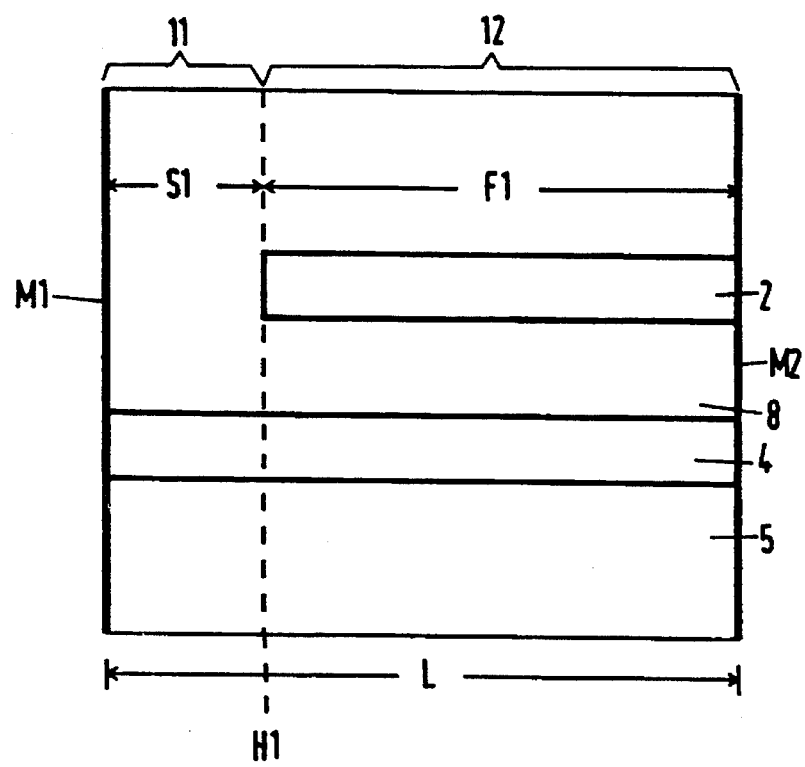
Figure 3:
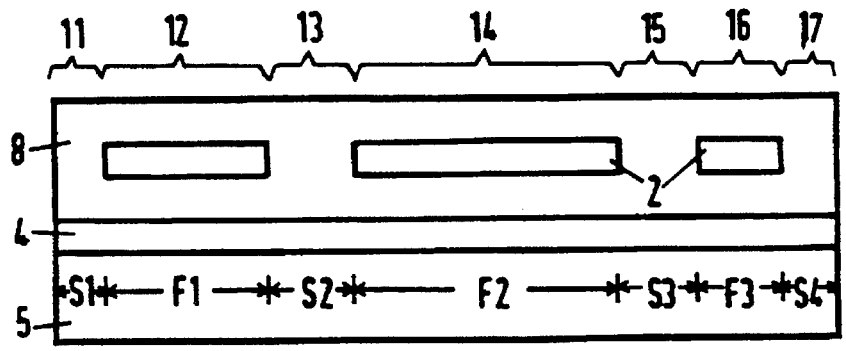
Figure 4:
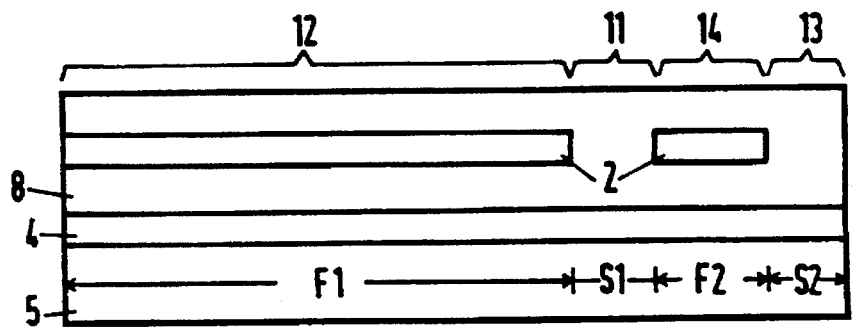

A near selection that is greater by approximately 3 dB is possible with the structure modified according to FIG. 2, since the length F1 of the double region 12 here is effectively doubled because of the reflection of the radiation at the right-hand resonator end mirror M2. A simultaneous optimization of the near selection and far selection is possible by series connection of a plurality of filter regions of different length, as schematically shown in FIGS. 3 and 4. In FIG. 3, a first single region 11, a second single region 13, a third single region 15 and a fourth single region 17 having the respective lengths S1, S2, S3 and S4 are shown. Each of these regions are interrupted by a first double region 12, a second double region 14 and a third double region 16 having the respective lengths F1, F2 and F3. The second waveguide 2 provided for the coupling is correspondingly divided into sections having the lengths F1, F2 and F3 in longitudinal direction. Each of these regions are embedded into the cladding layer 8. Due to the different lengths of these different sections, a good selection of a single wavelength from the overall spectrum is achieved. A first double region 12 having an especially great length F1 and a second double region 14 having a substantially shorter length F2 are provided in the structure shown in FIG. 4. A combination of the good near selection, as shown by the filter curve of FIG. 5a, with the good far selection as shown by the filter curve of FIG. 5b thus derives. The filter curve of FIG. 5c is therefore achieved as transmission characteristic for this embodiment of FIG. 4. It is thereby particularly significant that a uniform and equally strong tuning occurs given the common contacting of the various sections, so that the two filter curves fundamentally shift synchronously in common on the wavelength scale without further measures when the wavelength is modified by modifying the tuning current. This represents a critical simplification in the manipulation of the VMZ laser diode (particularly compared to the structure disclosed in the initially cited publication by Oeberg et al.) since the user need not be concerned with the mutual adjustment of near and far selection.

The layer structure of a practical embodiment of the VMZ laser shall be set forth with reference to FIG. 6–8 and the attached tables. FIG. 6 shows the longitudinal section of a VMZ laser diode according to the exemplary embodiment of FIG. 1. The waveguide 4 is applied as a stripe-shaped layer onto a substrate 5 or onto the uppermost layer of an epitaxially overgrown semiconductor wafer. The further waveguide 2 is embedded between cladding layers 1, 3 present on this waveguide 4 in the section (double region) provided for the coupling. The sections outside the coupling regions (single regions) are filled up with the cladding layers 6. In the embodiment of FIG. 6, the further waveguide 2 is 3-layer and has an active layer 2a, a parting layer 2s and a tuning layer 2t. A tuning layer can be alternatively arranged at that side of the parting layer facing away from the substrate. The active layer is then situated between the parting layer and the substrate. Excellent tuning properties occur when the active layer and the tuning layer are arranged together in one of the waveguides because the tuning range is enlarged—by approximately 30–50% in this case—due to the interaction (via the optical losses produced by the tuning) between the tuning layer and the active layer. It is also possible to fashion both waveguides single-layer, whereby the one waveguide then represents the active layer and the other waveguide represents the tuning layer. The waveguides 2, 4 can also be produced as quantum well layers or multi-quantum well layers.

Figure 7:
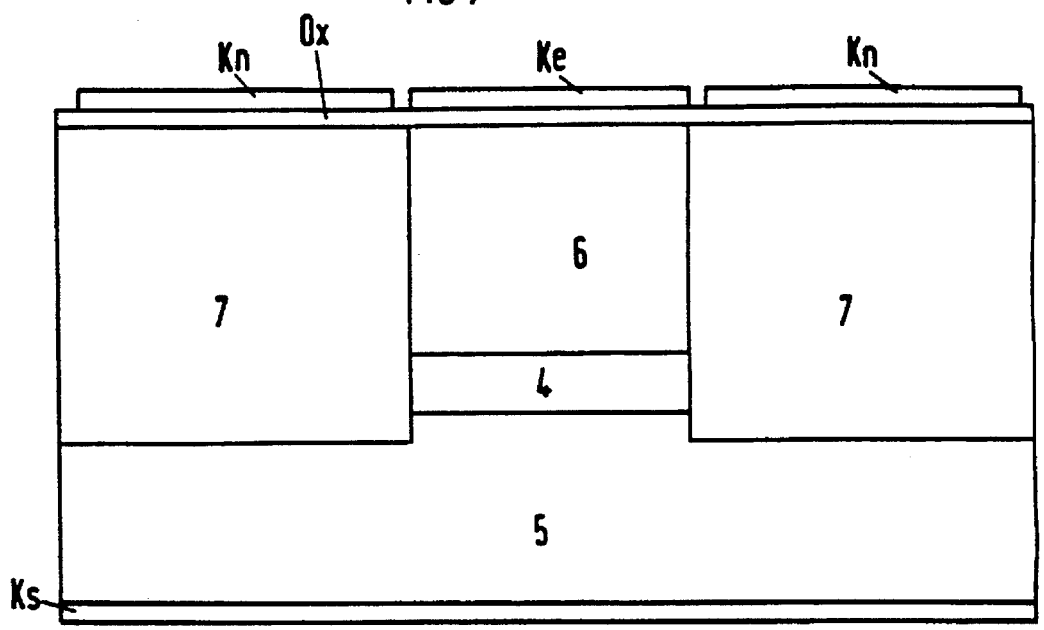
FIGS. 7 and 8 show the cross sections of the present invention referenced in FIG. 6.
Figure 8:
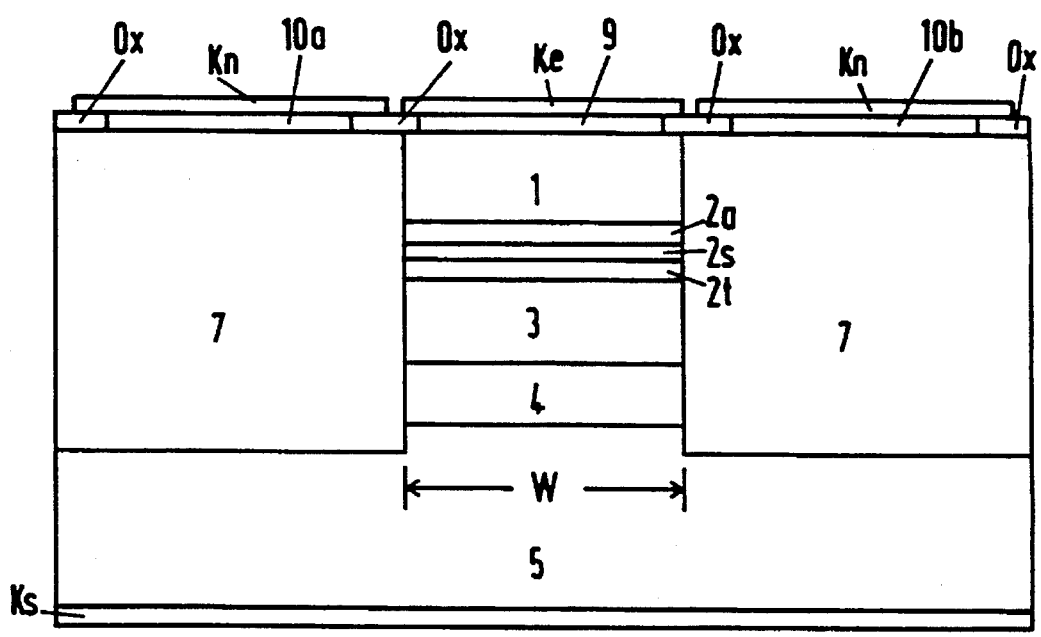

The sections entered in FIG. 6 are shown in FIGS. 7 and 8. The lateral cladding layers 7 that limit the stripe-shape layer structure of the double waveguide are shown in FIGS. 7 and 8. Highly doped contact layers 9, 10a, 10b are respectively applied onto the various regions of the cladding layers. The remaining semiconductor material is doped such that the cladding layer 1, the cladding layer 3, the waveguide 4, the substrate 5 and the contact layer 9 on the cladding layer 1 are doped for electrical conduction of a first conductivity type. The parting layer 2s, the upper cladding layer 6 in the single regions, the lateral cladding layers 7 and the contact layers 10a and 10b on the lateral cladding layers 7 are doped for electrical conduction of the opposite conductivity type. For example, the first conductivity type is advantageously p-conduction and the second conductivity type is n-conduction. The respective contacts Ke, Kn, Ks for the electrical conduction toward the outside are applied onto the contact layers 9, 10 and on the substrate 5. The region between the contact layers on the upper side can be planarized with an oxide layer Ox.

Typical material combinations and dopings as well as the thicknesses of the individual layers are recited in attached Table 1 for an exemplary embodiment in the material system of InP. When the active layer and the tuning layer are each respectively established by one of the two waveguides 2, 4, the cladding layer 3 located therebetween for the substrate 5 and the upper cladding layer 1 must be correspondingly doped with the opposite conductivity type. The cladding layer 3 is then n-InP and the waveguides 2, 4 are undoper InGaAsP. Further parameters of the disclosed exemplary embodiment recited in Table 1 include:

a wavelength of 1.5 μm a strip width W of 1–2 μm.

Effective index difference between mode R and S: approximately 0.1

Basic period Λ: 15 μm

Dispersion β:2

Optical confinement factor in the tuning layer: approximately 30%

Table 2 recites typical length dimensions, the spacing of the resonant wavelengths and the tuning region for the embodiments of FIGS. 1, 2 and 4. A typical value is respectively recited in parenthesis in Table 1 for the recited regions.

The double regions wherein two waveguides are present vertically relative to one another are referred to in common as coupling region. Dependent on the embodiment of the VMZ laser diode, this coupling region can have one or more interconnected sections. In the simplest embodiment, the lower waveguide 4 is applied directly onto a substrate 5. Instead of a substrate, this semiconductor layer can also be a lower cladding layer 5. When the active layer or the tuning layer is fashioned in the lower waveguide 4 and a doped, lower cladding layer 5 is present for the power supply into this lower waveguide layer 4, the appertaining terminal contact can be applied on the upper side, so that a semi-insulating substrate can also be used. The measurers provided for the separate current injection into the active layer and into the tuning layer correspond to those of a known TTG laser diode, particularly to those of the initially cited ACA laser diode.

Although other modifications and changes may be suggested by those skilled in the art, it is the intention of the inventor to embody within the patent warranted hereon all changes and modifications as reasonably and properly come within the scope of his contribution to the art.

TABLE 1

| Number | Material | λg (μm) | Doping ($10^{17}$ cm$^{-3}$) | Thickness (μm) | Function |
|---|---|---|---|---|---|
| 1 | p-Inp | 0.92 | 1–10 (5) | 1–3 (2) | Cladding Layer |
| 2a | InGaAsP | 1.56 | 0–10 (0) | 0.05–0.3 (0.15) | Active Layer |
| 2s | n-InP | 0.92 | 5–50 (20) | 0.05 | Parting Layer |
| 2t | InGaAsP | 1.35 | 0–20 (0) | 0.05–0.4 (0.2) | Tuning Layer |
| 3 | p-InP | 0.92 | 2–20 (5) | 0.1–0.5 (0.3) | Cladding Layer |
| 4 | p-In-GaAsP | 1.05 | 1–5 (2) | 0.1–0.7 (0.5) | Waveguide |
| 5 | p-Inp | 0.92 | 5–20 (10) | 50–200 (100) | Substrate |
| 6 & 7 & 8 | n-InP | 0.92 | 5–50 (10) | 0.5–5 (3.5) | Cladding Layer |
| 9 | p-InGaAsP | 1.3 | 100–1000 (500) | 0.03–0.5 (0.2) | Contact Layer |
| 10a & 10b | n-InGaAsP | 1.1–1.67 (1.67) | 10–500 (200) | 0.03–0.5 (0.2) | Contact Layer |
| Ox | Oxide (Al, Si) | — | — | 0.03–0.3 (0.2) | Insulation |
| Ks & Ke | Ti/Pt/Au | — | — | 0.2–1 (0.5) | p-contact |
| Kn | Ti/Pt/Au | — | — | 0.2–1 (0.5) | n-contact |

| Type According to FIG. Number | Overall Length L (μm) | F1 (μm) | F2 (μm) | S1 (μm) | S2 (μm) | Δλ (nm) | Tuning Range (nm) |
|---|---|---|---|---|---|---|---|
| 1 | 200 | 180 | — | 10 | 10 | 66 | 66 |
| 2 | 200 | 180 | — | 20 | — | 33 | 33 |
| 4 | 200 | 150 | 30 | 10 | 10 | 37.5 | 67.5 |

I claim:

1. Tunable laser diode, comprising:

a first and a second waveguide arranged in a layer plane as layers vertically above one another with respect to said layer plane and separated from one another by a cladding layer, said first and second waveguides being arranged so closely adjacent to one another so that a mode coupling occurs between said waveguides;

wherein said first waveguide is located only in a coupling region that has a length less than the entire length of a section of the laser diode provided as a laser resonator;

wherein said first and second waveguides have such dimensions and material combinations such that a coupling of two different modes occurs in said coupling region;

wherein said coupling region has at least one interconnected section having a length equal to a natural multiple of the coupling length of said two different modes;

an active layer and a tuning layer arranged vertically relative to one another with respect to said layer plane in said first and second waveguide in said coupling region; and means for separately injecting currents into said active layer and into said tuning layer.

2. Laser diode according to claim 1, Wherein said coupling region comprises one interconnected section.

3. Laser diode according to claim 1, wherein said coupling region comprises a plurality of interconnected sections, said plurality of interconnected sections having different lengths that are each a respective natural multiple of said coupling length of the modes to be coupled.

4. Laser diode according to claim 1, wherein said active layer: is formed by said first waveguide and said tuning layer is formed by said second waveguide, said cladding layer located between said waveguides is doped for electrical conduction of a first conductivity type, said laser diode further comprising:
- a plurality of semiconductor layers on a respective side of said waveguides facing away from said cladding layer doped for electrical conduction of a second opposite conductivity type; and
- a plurality of contacts each electrically conductively connected to said cladding layer and to said plurality of semiconductor layers to provide a separate current injection into said waveguides.

5. Laser diode according to claim 1, wherein said active layer and said tuning layer further comprise:
- a multi-layer layer structure in said first waveguide, said layer structure having a parting layer between said active layer and said tuning i layer, said parting layer being doped for electrical conduction with a dopant having a first conductivity type; said laser diode further comprising:
- a plurality of semiconductor layers on a sidle of said active layer and said tuning layer respectively facing away from said parting layer: are doped for electrical conduction with a dopant having a second opposite conductivity type; and
- a plurality of contacts respectively electrically conductively connected to said parting layer and to said semiconductor layers to provide a separate current injection into said active layer and into said tuning layer.

6. Laser diode according to claim 1, wherein said cladding layers are InP, said waveguides comprise at least layer portions of InGaAsP; and wherein said waveguides have different compositions.

7. Laser diode according to claim 1, further comprising:
- a stripe-shaped waveguide on a lower cladding layer and having a length equal to the entire length of the section provided as said laser resonator;
- a cladding layer on said waveguide;
- a further stripe-shaped waveguide on said (cladding layer;
- wherein said further waveguide is arranged parallel to said stripe-shaped waveguide and vertically relative thereto with respect to the layer structure, said further waveguide having a length of less than the entire length thereof;
- an upper cladding layer on said further waveguide;
- lateral cladding layer having said waveguides situated therebetween;
- a plurality of highly doped contact layers applied on said upper cladding layer and on said lateral cladding layers;
- a plurality of contacts applied to said plurality of highly doped contact layers; and
- wherein said cladding layers are doped for electrical conduction so that said plurality of contacts are electrically conductively connected to said cladding layers vertical relative to said waveguides such that separate currents can be injected into an active layer in one of said waveguides and into a tuning layer in another one of said waveguides.

8. Laser diode according to claim 7, wherein said active layer and said tuning layer are arranged in said first waveguide separated by a parting layer;
- said upper cladding layer is p-conductively doped with a doping density of $10^{17}$ cm$^{-3}$– $10^{18}$ cm$^{-3}$;
- said active layer has a doping density of at most $10^{18}$ cm$^{-3}$;
- said parting layer is n-conductively doped with a doping density of $5\times10^{17}$ cm$^{-3}$–$5\times 10^{18}$ cm$^{-3}$;
- said tuning layer has a doping density of at most $2\times10^{18}$ cm$^{-3}$;
- said cladding layer between said first and second waveguide is p-conductively doped with a doping density of $2\times10^{17}$ cm$^{-3}$–$2\times10^{18}$ cm$^{-3}$;
- said second waveguide, which does not contain said active layer, is p-conductively doped with a doping density of $10^{17}$ cm$^{-3}$–$5\times10^{17}$ cm$^{-3}$;
- said lower cladding layer is p-conductively doped with a doping density of $5\times10^{17}$ cm$^{-3}$– $10^{18}$ cm$^{-3}$; and
- remaining cladding layers are n-conductively doped with a doping density of $5\times10^{17}$ cm$^{-3}$– $5\times10^{18}$ cm$^{-3}$.

9. Laser diode according to claim 8, wherein said upper cladding layer is 1 μm–3 μm thick; said active layer is 0.05 μm–0.3 μm thick; said tuning layer is 0.05 μm–0.4 μm thick; said cladding layer between said first and second waveguide is 0.1 μm–0.5 μm thick; and said second waveguide that does not contain said active layer is 0.1 μm–0.7 μm thick.

10. Laser diode according to claim 1, wherein said first waveguide that is present only in a coupling region comprises an interconnected section having a length of at least three-quarters the length of the laser resonator.

* * * * *